United States Patent
Hung et al.

(10) Patent No.: US 7,413,922 B2
(45) Date of Patent: Aug. 19, 2008

(54) FABRICATING METHOD OF A PIXEL STRUCTURE

(75) Inventors: Meng-Yi Hung, Taoyuan (TW); Ming-Hung Shih, Taoyuan (TW)

(73) Assignee: Au Optronics Corporation, Hsinchu (TW)

( * ) Notice: Subject to any disclaimer, the term of this patent is extended or adjusted under 35 U.S.C. 154(b) by 167 days.

(21) Appl. No.: 11/309,805

(22) Filed: Sep. 29, 2006

(65) Prior Publication Data

US 2007/0099354 A1    May 3, 2007

Related U.S. Application Data

(62) Division of application No. 10/907,490, filed on Apr. 4, 2005, now Pat. No. 7,196,352.

(30) Foreign Application Priority Data

Dec. 24, 2004    (TW) .............................. 93140424 A

(51) Int. Cl.
*H01L 21/84* (2006.01)
(52) U.S. Cl. .................. 438/70; 438/155; 438/161; 438/609; 257/E21.027
(58) Field of Classification Search ............. 438/161
See application file for complete search history.

(56) References Cited

U.S. PATENT DOCUMENTS

| 5,840,602 A * | 11/1998 | Han et al. ............. 438/153 |
| 5,915,173 A * | 6/1999 | Kwon ................... 438/161 |
| 6,080,606 A * | 6/2000 | Gleskova et al. ....... 438/151 |
| 6,338,990 B1 * | 1/2002 | Yanai et al. ........... 438/160 |
| 7,186,634 B2 * | 3/2007 | Yoneya ................ 438/597 |
| 2001/0040645 A1 * | 11/2001 | Yamazaki ............. 349/42 |

* cited by examiner

*Primary Examiner*—Stephen W Smoot
(74) *Attorney, Agent, or Firm*—Jianq Chyun IP Office

(57) ABSTRACT

A method of fabricating a pixel structure is disclosed. A substrate having a color filter layer thereon and a leveling layer further covers the color filter layer is provided. A first metal layer is formed over the leveling layer. The first metal layer is patterned to define a source/drain. A channel material layer, a gate insulating layer and a second metal layer are formed over the substrate to cover the source/drain. The second metal layer, the gate insulating layer and the channel material layer are patterned to define a gate and a channel layer. A passivation layer is formed over the substrate to cover the gate. The passivation layer is patterned to expose a portion of the drain. A transparent conductive layer is formed over the substrate, and is electrically connected to the exposed drain. Thereafter, the transparent conductive layer is patterned to form a pixel electrode.

6 Claims, 9 Drawing Sheets

FABRICATING METHOD OF A PIXEL STRUCTURE

CROSS-REFERENCE TO RELATED APPLICATION

This is a divisional application of patent application Ser. No. 10/907,490, filed on Apr. 4, 2005 now U.S. Pat. No. 7,196,352, which claims the priority benefit of Taiwan patent application serial no. 93140424, filed on Dec. 24, 2004 and is now pending. The entirety of each of the above-mentioned patent applications is hereby incorporated by reference herein and made a part of this specification.

BACKGROUND OF THE INVENTION

1. Field of the Invention

The present invention relates to a method of fabricating a pixel structure, and more particularly, to a method of fabricating a pixel structure using the array on color filter (AOC) technique.

2. Description of the Related Art

A Thin Film Transistor Liquid Crystal Display (TFT LCD) is generally composed of a TFT array substrate, a color filter array substrate, and a liquid crystal layer between two substrates. In addition, in an alternative method of fabricating LCDs, the TFT array is fabricated on the color filter array, called an array on color filter (AOC) technique. In other words, in such method, a color filter array is formed over the substrate, and the TFT array is formed over the color filter array later.

In general, the TFT array substrate comprises a plurality of pixel structures, wherein each pixel comprises a TFT and a pixel electrode that is typically formed by a five-photomask process. Wherein, in the first photomask process, a first metal layer is defined for forming components such as a scanning line and a gate of the TFT. In the second photomask process, a channel layer of the TFT and an ohmic contact layer are defined. In the third photomask process, a second metal layer is defined for forming components such as a data line and a source/drain of the TFT. In the fourth photomask process, a passivation layer is patterned. In the fifth photomask process, a transparent conductive layer is patterned for forming a pixel electrode.

However, following the trend of larger-sized TFT LCDs, different kinds of problems and challenges, such as lowering yield rate and decreasing production capacity, are inevitable. Therefore, if the number of photomasks during the TFT fabricating process can be reduced, or the steps of exposure process in fabricating the TFT components can be reduced, the fabricating time can be reduced, the production capacity can be improved, and the manufacturing cost can be lowered.

A four-photomask process had been introduced and commonly used in manufacturing pixel structures, wherein one of the photomasks having halftone patterns is used, to reduce one photomask. However, for the photomask with halftone patterns, the photomask layout is harder to design and the choice of photoresist may be insufficient. In addition, in photomasks with halftone pattern, the photoresist patterns after exposure are usually not ideally uniform.

SUMMARY OF THE INVENTION

Therefore, it is an objective of the present invention to provide a method of fabricating a pixel structure. The method applies an Array on color filter (AOC) technique. In addition, in such method, only a four-photomask process is required and the photomask with halftone design is not used.

It is another object of the present invention to provide a pixel structure, which is fabricated in a four-photomask process, and the TFT in the pixel structure is fabricated on the color filter layer.

It is another object of the present invention to provide a method of fabricating a TFT, which is different from the conventional method of fabricating a TFT.

It is another object of the present invention to provide a TFT, wherein the structure of the TFT is different from that of the conventional TFT.

In order to achieve the objects mentioned above, the present invention provides a method of fabricating a pixel structure. First, a substrate having a color filter layer thereon is provided, wherein a leveling layer further covers the color filter layer, and a first metal layer is formed over the leveling layer. Then, a first photomask process is performed to pattern the first metal layer for forming a source and a drain. A channel material layer, a gate insulating layer and a second metal layer are sequentially formed over the substrate to cover the source and the drain. Then, a second photomask process is performed to pattern the second metal layer, the gate insulating layer and the channel material layer to define a gate and a channel layer. Then, a passivation layer is formed over the substrate to cover the gate. Afterwards, a third photomask process is performed to pattern the passivation layer to expose a portion of the drain. A transparent conductive layer is subsequently formed over the substrate, wherein the transparent conductive layer is electrically connected to the exposed drain. Thereafter, a fourth photomask process is performed to pattern the transparent conductive layer to form a pixel electrode.

The present invention further provides a pixel structure. The pixel structure comprises a color filter layer, a leveling layer, a TFT, a passivation layer, and a pixel electrode. Wherein, the color filter layer is disposed over a substrate, and the color filter layer is covered by the leveling layer. The TFT mentioned above is disposed over the leveling layer, wherein the TFT comprises a source, a drain, a channel layer that covers the source and the drain, a gate insulating layer disposed over the channel layer, and a gate disposed over the gate insulating layer. The passivation layer mentioned above covers the TFT and exposes a portion of the drain. The pixel electrode is disposed over the leveling layer, and the pixel electrode is electrically connected to the exposed drain.

The present invention further provides a method of fabricating a TFT. First, a substrate is provided. Then, a first metal layer is formed over the substrate, and the first metal layer is patterned to define a source and a drain. Then, a channel material layer, a gate insulating layer, and a second metal layer are sequentially formed over the substrate for covering the source and the drain. Afterwards, the second metal layer, the gate insulating layer, and the channel material layer are sequentially patterned to define a gate and a channel layer.

The present invention further provides a TFT. The TFT comprises a source, a drain, a channel layer, a gate insulating layer, and a gate. Wherein, the source and the drain are disposed over a substrate and covered by the channel layer. In addition, the gate insulating layer is disposed over the channel layer, and the gate is disposed over the gate insulating layer.

Different from the conventional technique, the TFT is fabricated on the color filer layer with the AOC technique in the present invention. In addition, the fabrication of the pixel structure only takes four photomask processes in the present invention, thus there is one photomask fewer compared to the conventional five-photomask process. Accordingly, the present invention has the advantage of increasing production capacity and reducing manufacturing cost. Moreover, during the four-photomask process in the present invention, the halftone pattern is not applied on the photomask, thus the issues of photomask layout design and photoresist selection can be avoided, and the uneven pattern after exposure is no longer a problem.

The difference between the present invention and the conventional technique is described in detail hereinafter. In terms of the sequence of forming gate on TFT and its location, the conventional gate of TFT is defined in the first photomask process, and the source and the drain are disposed over the gate and the channel layer. However, the gate of TFT of the present invention is defined in the second photomask process and the source and the drain are formed under the gate and the channel layer.

BRIEF DESCRIPTION OF THE DRAWINGS

The accompanying drawings are included to provide a further understanding of the invention, and are incorporated in and constitute a portion of this specification. The drawings illustrate embodiments of the invention, and together with the description, serve to explain the principles of the invention.

DESCRIPTION OF THE EMBODIMENTS

In the method of fabricating the pixel structure provided by the present invention, the pixel structure is fabricated in a four-photomask process without the halftone pattern design. In addition, since the color filter layer is already formed over the substrate, the substrate having multiple pixel structures and fabricated in the four-photomask process can be combined with another substrate for forming a TFT LCD. The description below only is the embodiment of the present invention and should not be used to limit the scope of the present invention.

Four-Step Photomask Process

The First Embodiment

Figure 1:
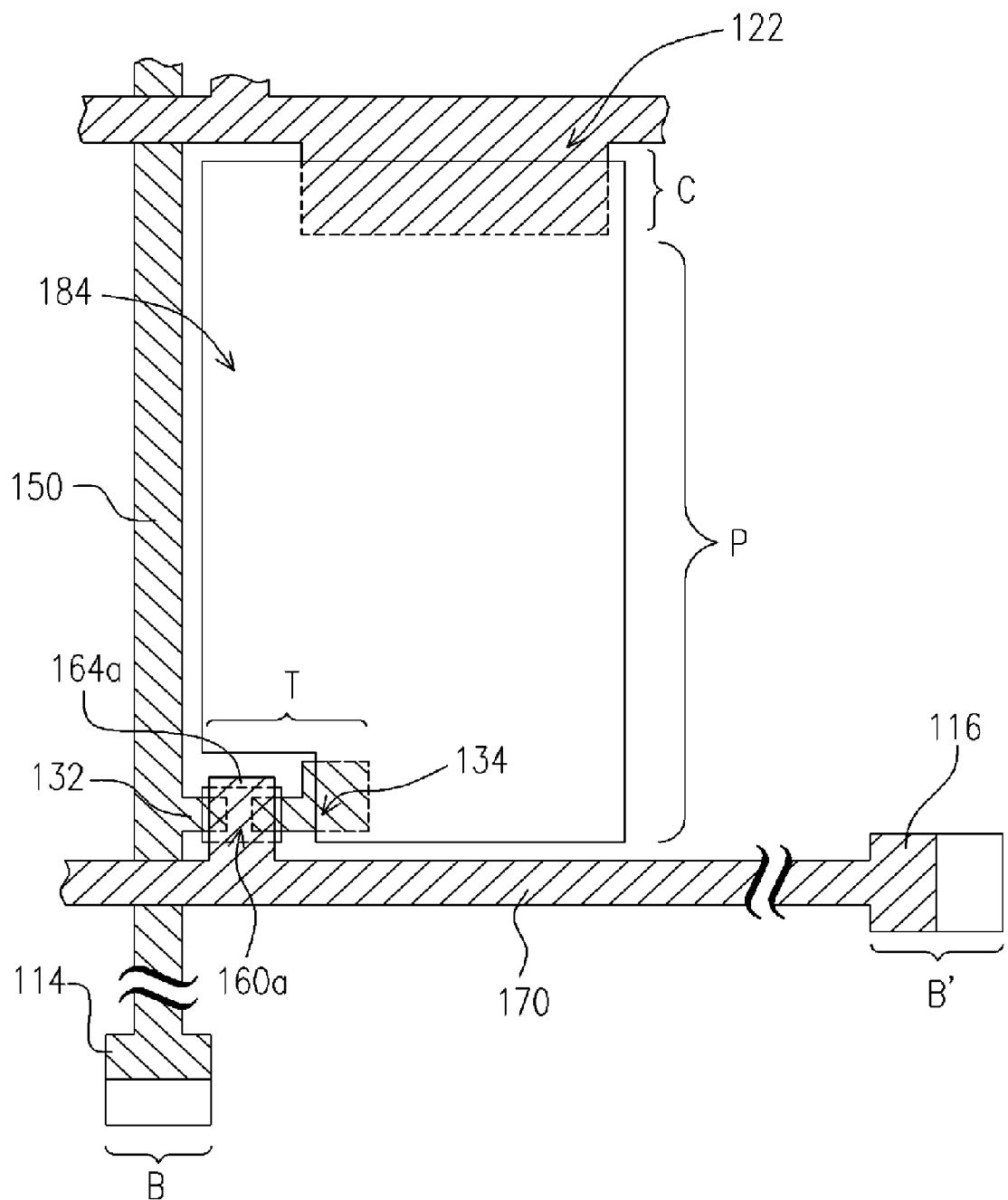
FIG. 1 schematically shows a top view of a pixel structure according to a first embodiment of the present invention.

FIG. 1 schematically shows a top view of a pixel structure according to a first embodiment of the present invention. FIGS. 4A~4I schematically show cross-sectional views illustrating a process of fabricating the pixel structure according to the first embodiment of the present invention.

Figure 4A:
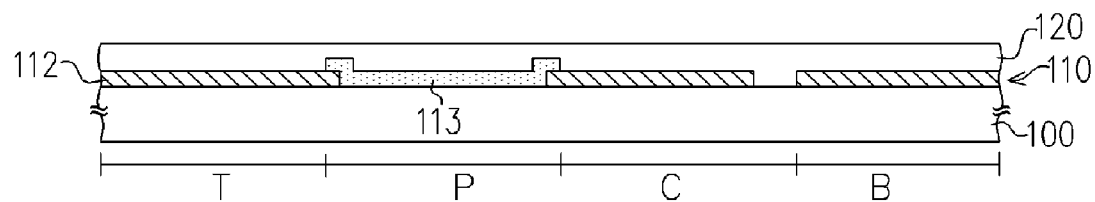
FIGS. 4A~4I schematically show cross-sectional views illustrating a process of fabricating the pixel structure according to the first embodiment of the present invention.
Figure 4B:
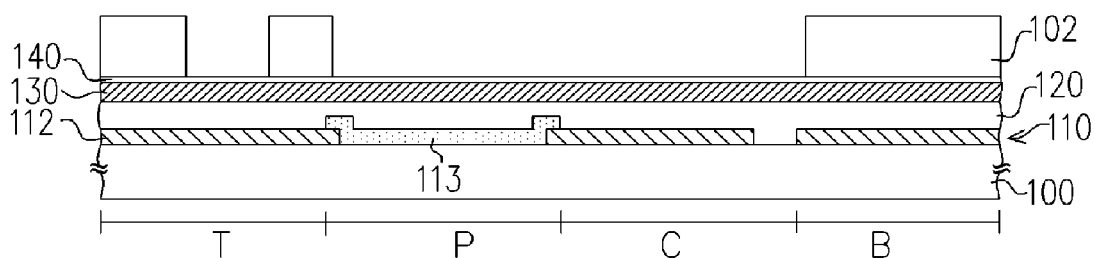

Referring to FIG. 1 and FIG. 4A, a substrate 100 is provided. Wherein, the substrate 100 comprises an area reserved for forming a TFT T, an area reserved for forming a pixel electrode P, an area reserved for forming a storage capacitor C, and an area reserved for forming bonding pads B and B'. In an embodiment of the present invention, the substrate 100 is, for example, a transparent glass substrate or a transparent plastic substrate, and a color filter layer 110 covered by a leveling layer 120 is already formed over the substrate 100. Note that the method of forming the color filter layer 110 on the substrate 100, for example, comprises forming a black matrix 112 first, wherein the black matrix 112 can be made of black resin, metal or by stacking Red, Green, or Blue filter patterns. Then, a plurality of color filter patterns 113, such as R filter patterns, G filter patterns, and B filter patterns, are formed in the regions defined by the black matrix 112. Afterwards, as shown in FIG. 4B, a first metal layer 130 is formed over the leveling layer 120. In an embodiment of the present invention, after the first metal layer 130 is formed, an ohmic contact material layer 140 is furthered formed thereon.

The first metal layer 130 mentioned above is, for example, a single-layer metal layer or a multi-layer metal layer structure. If the first metal layer 130 is single-layered, it may be made of Cr layer, W layer, Ta layer, Ti layer, Mo layer, Al layer, or an alloy layer composed of materials mentioned above. If the first metal layer 130 is multi-layered, it may a combination of Al/Cr/Al three-layer structure, Mo/Al/Mo three-layer structure, or Cr/Al two-layer structure. The ohmic contact material layer 140 mentioned above is, for example, doped amorphous-silicon.

Figure 4C:
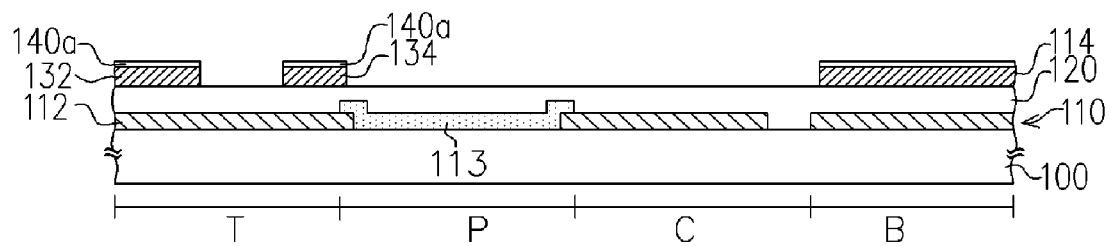

Referring to FIG. 4B, a first photomask process is subsequently performed, so as to form a patterned photoresist layer 102 on the ohmic contact material layer 140. Then, the photoresist layer 102 is used as an etching mask for the etching process, so as to pattern the ohmic contact material layer 140 and the first metal layer 130, and the patterned ohmic contact material layer 140a and the patterned first metal layer 132/134 have the same pattern as shown in FIG. 4C. In an embodiment of the present invention, in the first photomask process, a source 132 and a drain 134 are defined in the area reserved for forming TFT T. In addition, the first photomask process further comprises defining a data line 150 (as shown in FIG. 1) that is electrically connected to the source 132. In another embodiment of the present invention, the first photomask process further comprises defining a first bonding pad 114 in the area reserved for forming the bonding pad B on the edge of the substrate 100, and the first bonding pad 114 is electrically connected to the data line 150.

Figure 4D:
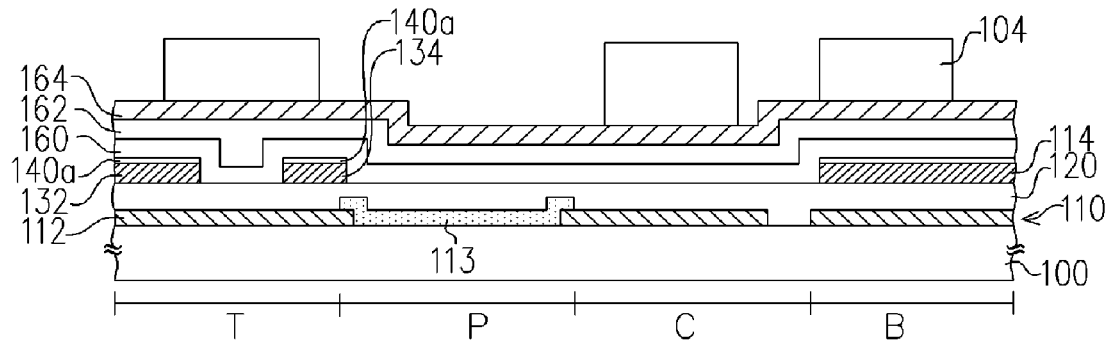

Referring to FIG. 1 and FIG. 4D, a channel material layer 160, a gate insulating layer 162, and a second metal layer 164 are sequentially formed over the substrate 100 for covering the structure 100 mentioned above. Moreover, the second metal layer 164 mentioned above is, for example, a single-layer metal layer or a multi-layer metal layer structure. If the second metal layer 164 is single-layered, it may be made of Cr layer, W layer, Ta layer, Ti layer, Mo layer, Al layer, or an alloy layer composed of materials mentioned above. If the second metal layer 164 is multi-layered, it may a combination of Al/Cr/Al three-layer structure, Mo/Al/Mo three-layer structure, or Cr/Al two-layer structure.

Figure 4E:
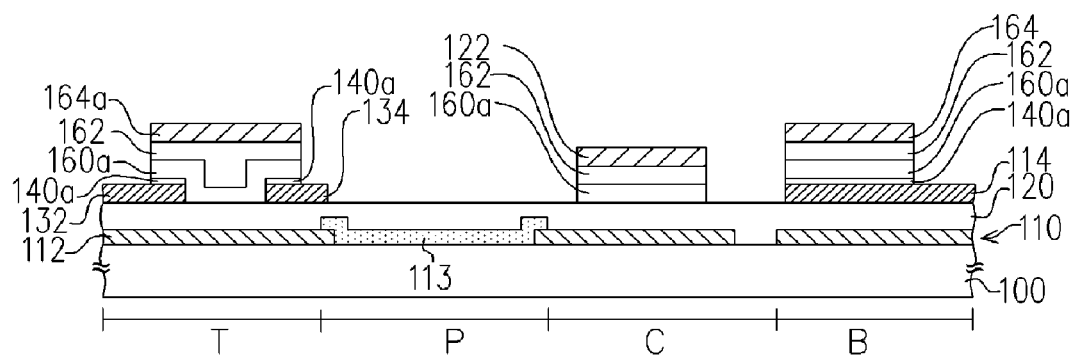

In an embodiment of the present invention, the channel material layer 160 is, for example, made of amorphous-silicon. The gate insulating layer is, for example, made of silicon nitride, silicon oxide, or silicon oxynitride. Then, a second photomask process is performed, so as to form a patterned photoresistor layer 104 on the second metal layer 164, and the photoresist layer 104 is used as an etching mask for the etching process as shown in FIG. 4E, in order to pattern the second metal layer 164, the gate insulating layer 162, and the channel material layer 160. In an embodiment of the present invention, in the second photomask process, a gate 164a and a channel layer 160a are defined in the area reserved for forming TFT T. In addition, the second photomask process further comprises defining a scanning line 170 (as shown in FIG. 1) that is electrically connected to the gate 164a.

In another embodiment of the present invention, the second photomask process further comprises defining a bottom electrode 122 in the area reserved for forming the storage capacitor C, and the storage capacitor C is, for example, a Cst on gate. In another embodiment of the present invention, the second photomask process further comprises defining a second bonding pad 116 (as shown in FIG. 1, and its cross-sectional view is similar to the bonding pad B) in the area reserved for forming the bonding pad B' on the other edge of the substrate 100, and reserving a portion of the second metal layer 164 in the area of the bonding pad B. Here, the second bonding pad 116 is electrically connected to the scanning line 170.

Figure 4F:
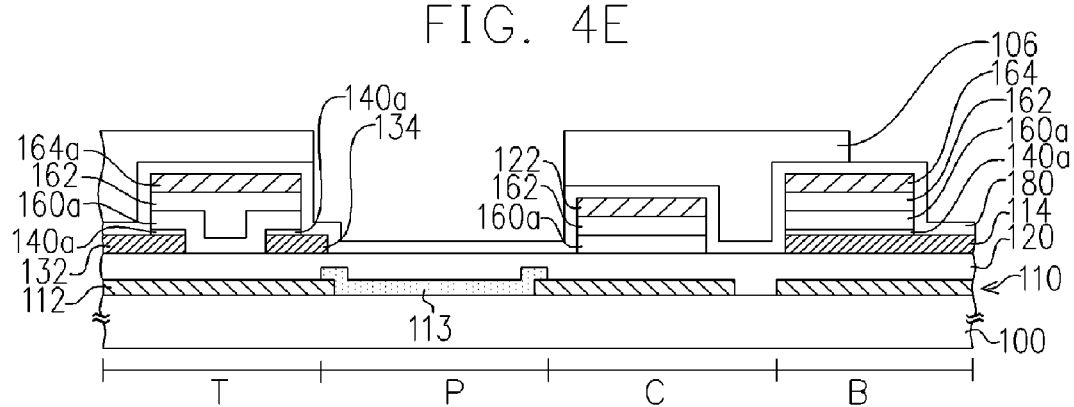
Figure 4G:
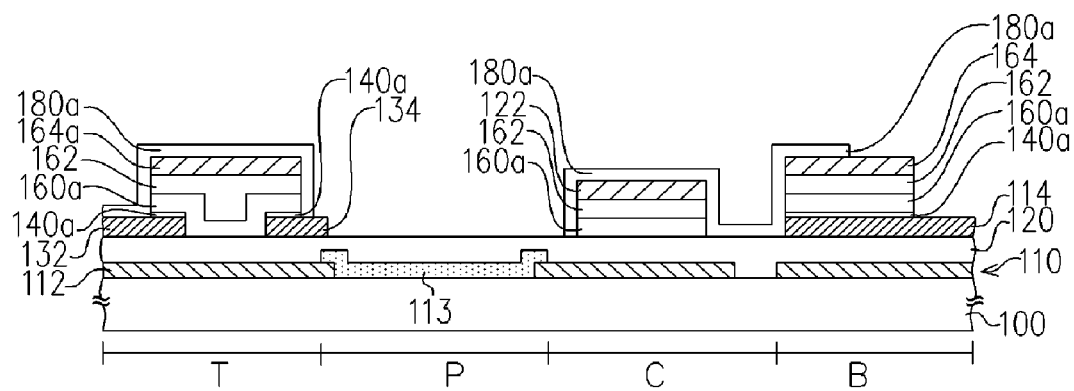

Referring to FIG. 1 and FIG. 4F, a passivation layer 180 is disposed over the substrate 100 for covering the structure mentioned above. In an embodiment of the present invention, the passivation layer 180 is, for example, made of silicon nitride, silicon oxide, silicon oxynitride, or organic material. Then, a third photomask process is performed to form a patterned photoresist layer 106 on the passivation layer 180. The photoresist layer 106 is used as an etching mask for the etching process to pattern the passivation layer 180 and to form a patterned passivation layer 180a as shown in FIG. 4G.

In an embodiment of the present invention, a portion of the drain 134 is exposed by the patterned passivation layer 180a. In another embodiment of the present invention, the third photomask process further comprises reserving the passivation layer 180a above the bottom electrode 122 as a capacitance dielectric layer. In another embodiment of the present invention, the third photomask process further comprises exposing a portion of the fist bonding pad 114 and a portion of the second bonding pad 116.

Figure 4H:
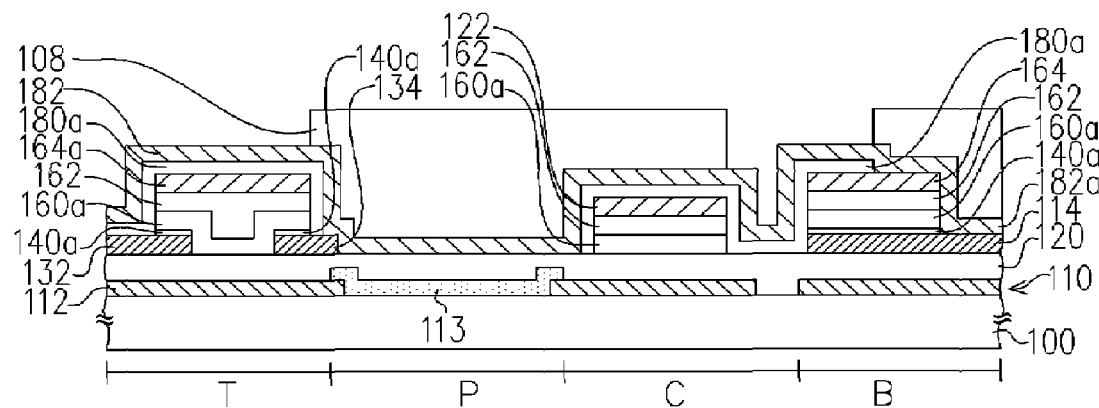
Figure 4I:
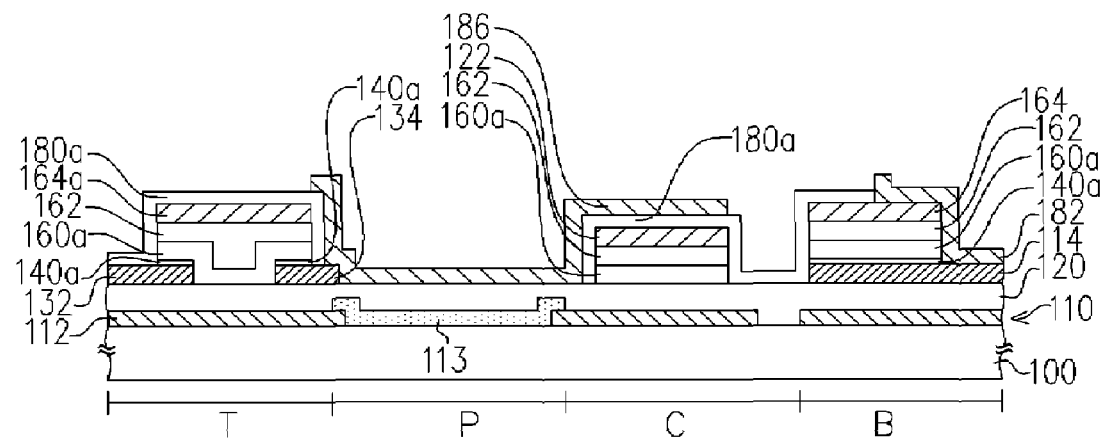

Referring to FIG. 1 and FIG. 4H, a transparent conductive layer 182 is formed over the substrate 100, and the transparent conductive layer 182 is electrically connected to the exposed drain 134. In an embodiment of the present invention, the transparent conductive layer 182 can be made of ITO or IZO. Then, a fourth photomask process is performed on the transparent conductive layer 182 to form a patterned photoresist layer 108 on the transparent conductive layer 182. The photoresist layer 108 is used as an etching mask for the etching process to pattern the transparent conductive layer 182, and the patterned transparent conductive layer 182a is as shown in FIG. 4I. In an embodiment of the present invention, the fourth photomask process comprises defining a pixel electrode 184 in the area reserved for forming the pixel electrode P.

Figure 2:
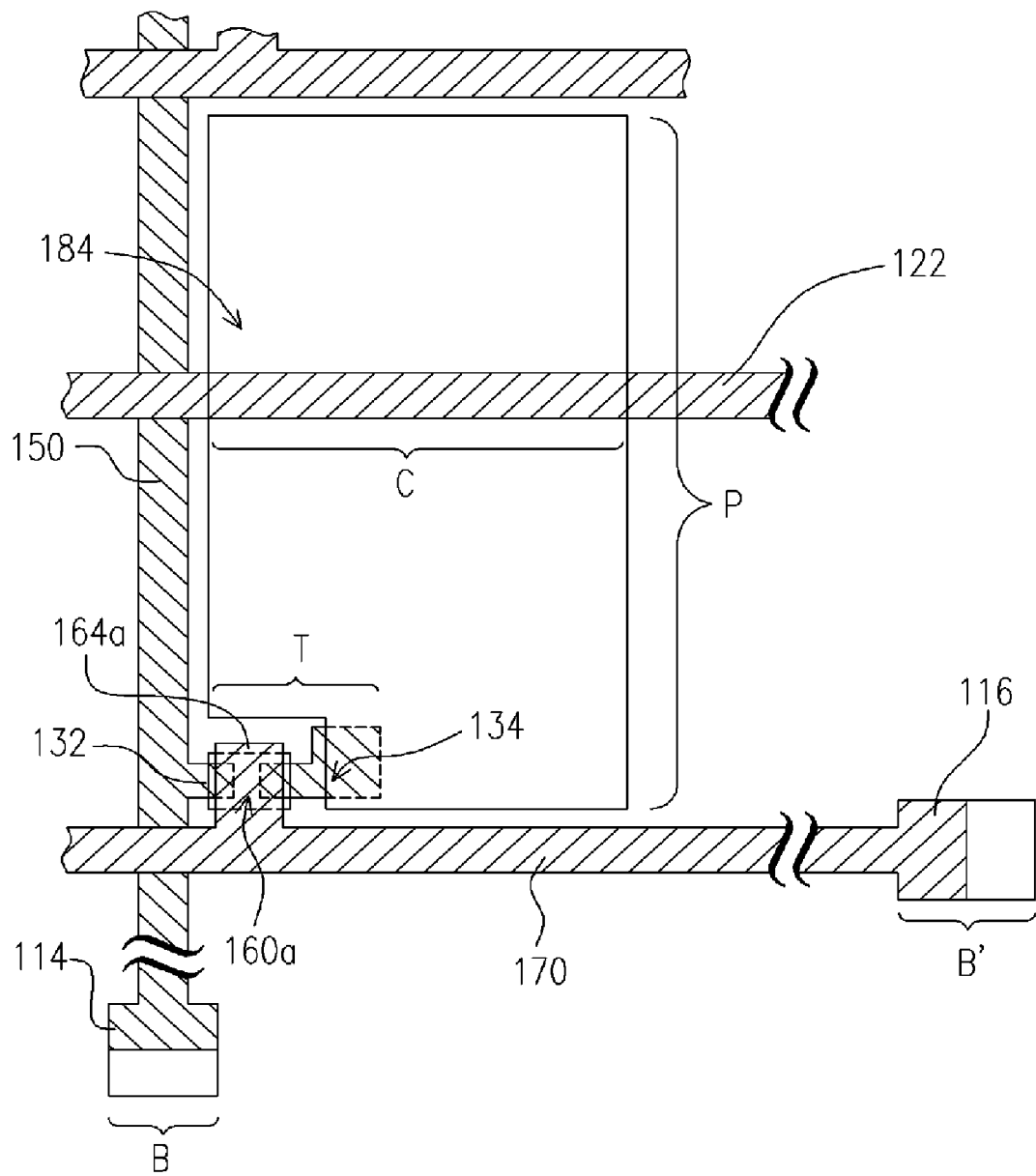
FIG. 2 schematically shows a top view of another pixel structure of the TFT LCD according to the first embodiment of the present invention.

In another embodiment of the present invention, the fourth photomask process further comprises reserving the transparent conductive layer, which is disposed above the passivation layer 180a above the bottom electrode 122, and the transparent conductive layer is used as a top electrode 186. The top electrode 186, the bottom electrode 122, and the dielectric material between two electrodes (i.e. the passivation layer 180a) together constitute a pixel storage capacitor. Note that the storage capacitor C mentioned above is not necessarily limited to the storage capacitor disposed over the gate layer, it may be the Cst on common (as shown in FIG. 2).

In another embodiment of the present invention, the fourth photomask process further comprises reserving the transparent conductive layer 182a that is disposed over the first bonding pad 114 and the second bonding pad 116. For the area where the bonding pad B is formed, through the transparent conductive layer 182a, the first bonding pad 114 is electrically connected to the second metal layer 164 that is formed over the first bonding pad 114. Similarly, for the area where the bonding pad B' is formed, through the transparent conductive layer 182a, the second bonding pad 116 is electrically connected to the first metal layer (not shown) that is formed below the second bonding pad 116.

Pixel Structure

Referring to FIG. 1 and FIG. 4I, the pixel structure formed by the four-photomask process mentioned above comprises a color filter layer 110, a leveling layer 120, a TFT T, a passivation layer 180a, and a pixel electrode P. Wherein, the color filter layer 110 is disposed over a substrate 100 and covered by the leveling layer 120. The color filter layer 110, for example, comprises a black matrix 112 and a plurality of color filter patterns 113 disposed in the regions defined by the black matrix 112. The color filer patterns are, for example, a plurality of R filter patterns, G filter patterns, and B filter patterns.

The TFT mentioned above is disposed over the leveling layer 120, and the TFT T comprises a source 132, a drain 134, a channel layer 160a covering the source 132 and the drain 134, a gate insulating layer 162 disposed over the channel layer 160a, and a gate 164a disposed over the gate insulating layer 162. In addition, the channel layer 160a mentioned above is made of amorphous-silicon, for example.

In another embodiment of the present invention, the pixel structure of the present invention further comprises an ohmic contact layer 140a, which is disposed between the source 132/drain 134 and the channel layer 160a. In addition, the passivation layer 180a covers the TFT T and exposes a portion of the drain 134. Moreover, the pixel electrode P is disposed over the leveling layer 120, and the pixel electrode P is electrically connected to the exposed drain 134.

In an embodiment of the present invention, the pixel structure of the present invention further comprises a storage capacitor C, which is disposed over the leveling layer 120. The storage capacitor C comprises a bottom electrode 122, a top electrode 186 (i.e. the transparent conductive layer), and a capacitance dielectric layer (i.e. the passivation layer 180a). The top electrode 186 is electrically connected to the pixel electrode P.

In an embodiment of the present invention, the pixel structure of the present invention further comprises a first bonding pad 114 and a second bonding pad 116, which are disposed over two edges of the substrate 100, and the first bonding pad 114 is electrically connected to the data line 150. In an embodiment of the present invention, through a transparent conductive layer 182a, the first bonding pad 114 is electrically connected to the second metal layer 164 that is disposed on the bonding pad area B. In addition, the second bonding pad 116 is electrically connected to scanning line 170. In an embodiment of the present invention, through a transparent conductive layer, the second bonding pad 116 is electrically connected to the first metal layer (not shown) that is disposed on the bonding pad area B'.

Four-Step Photomask Process

The Second Embodiment

Figure 3:
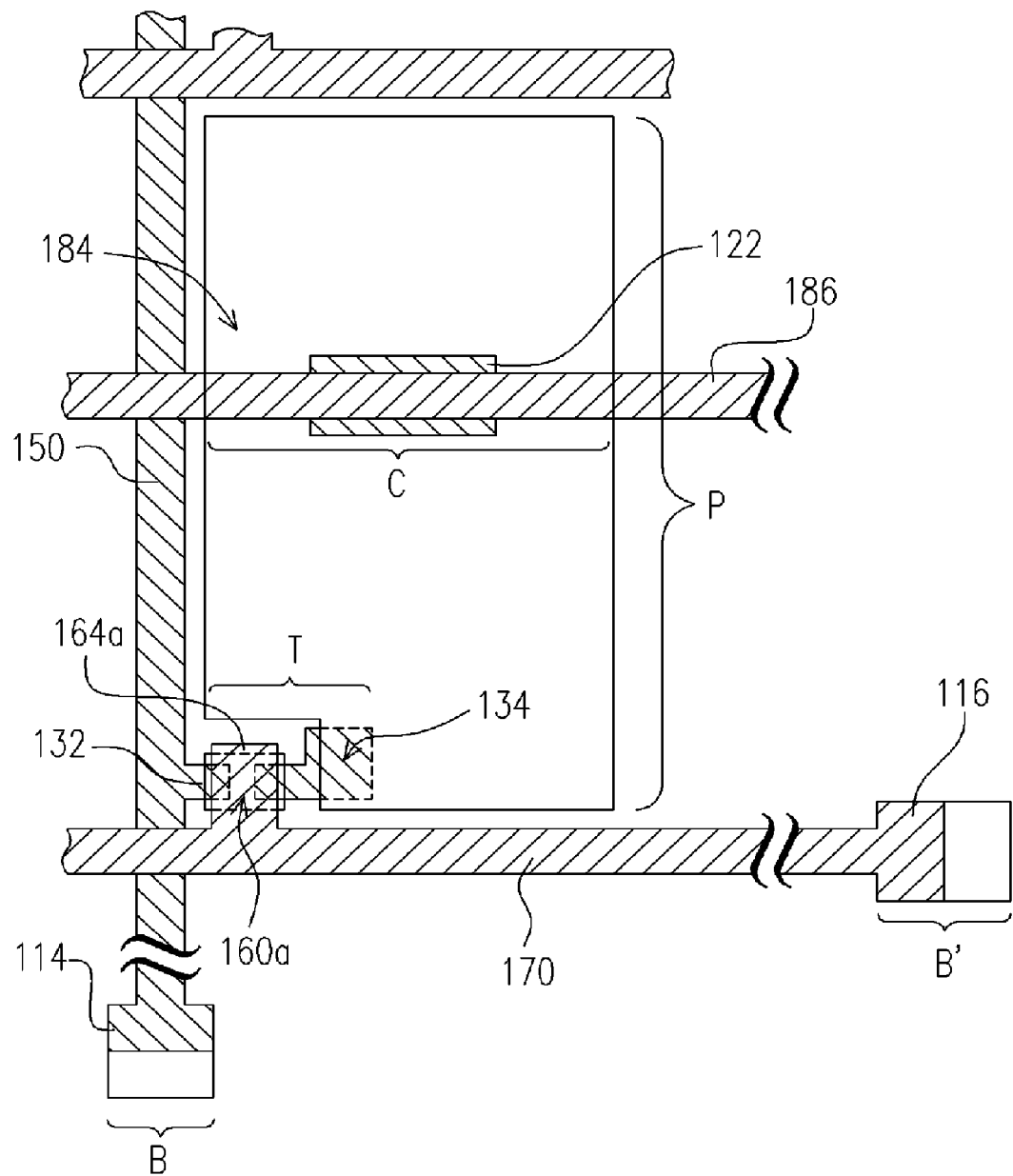
FIG. 3 schematically shows a top view of a pixel structure according to a second embodiment of the present invention.

FIG. 3 schematically shows a top view of a pixel structure according to a second embodiment of the present invention. FIGS. 5A~5I schematically show cross-sectional views illustrating a process of fabricating the pixel structure according to the second embodiment of the present invention. Noted that the process of fabricating the pixel structure in the second embodiment is similar to the first embodiment, thus only the difference therebetween is described hereinafter.

Figure 5A:
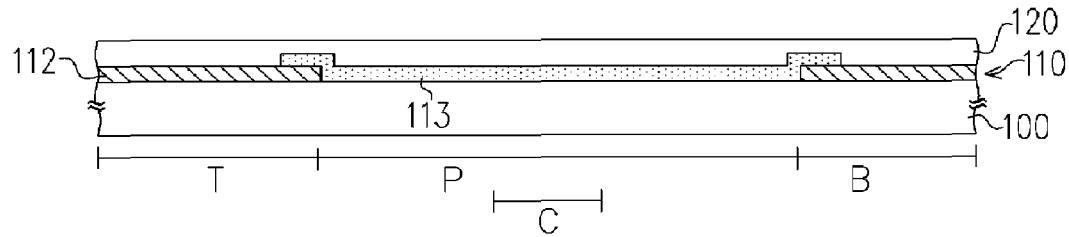
FIGS. 5A~5I schematically show cross-sectional views illustrating a process of fabricating the pixel structure according to the second embodiment of the present invention.
Figure 5B:
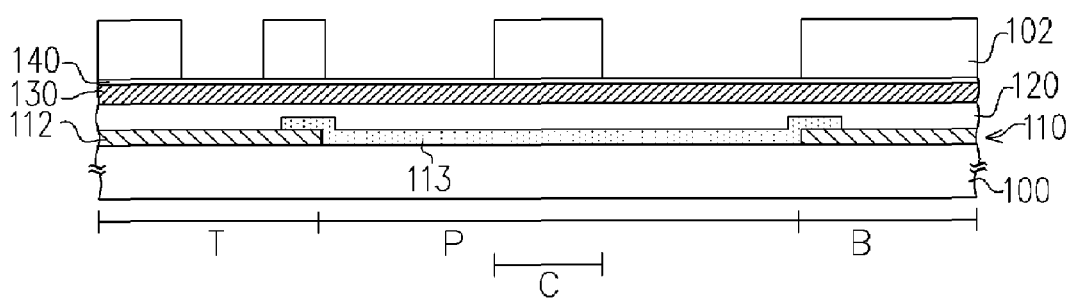
Figure 5C:
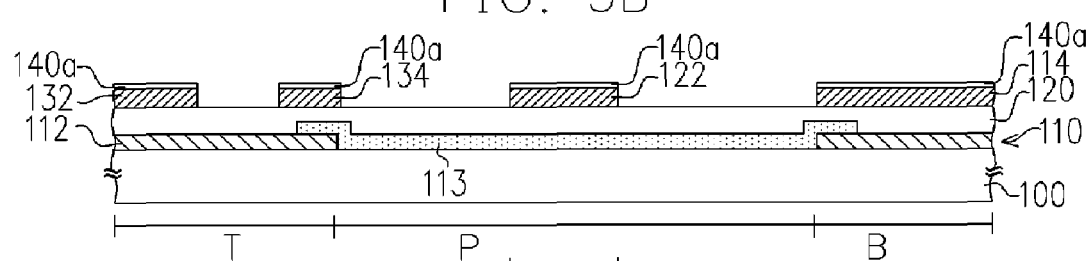

First, a step in FIG. 5A is performed, which is the similar to the one in FIG. 4A. Then, the first photomask process is performed referring to FIG. 5B, such that a patterned photoresist layer 102 is formed above the ohmic contact material layer 140. Then, an etching process is performed by using the photoresist layer 102 as an etch mask to define a source 132 and a drain 134 as shown in FIG. 3 and FIG. 5C. The first photomask process further comprises defining a bottom electrode 122 in the area reserved for forming a pixel electrode P. In another embodiment of the present invention, the first photomask process further comprises forming a first bonding pad 114 in the area reserved for forming the bonding pad B on one edge of the substrate 100, and the first bonding pad 114 is electrically connected to a data line 150.

Figure 5D:
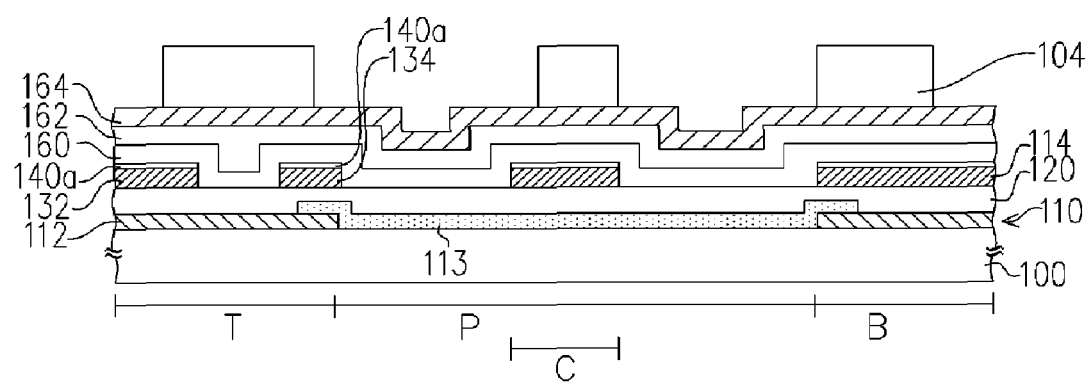
Figure 5E:
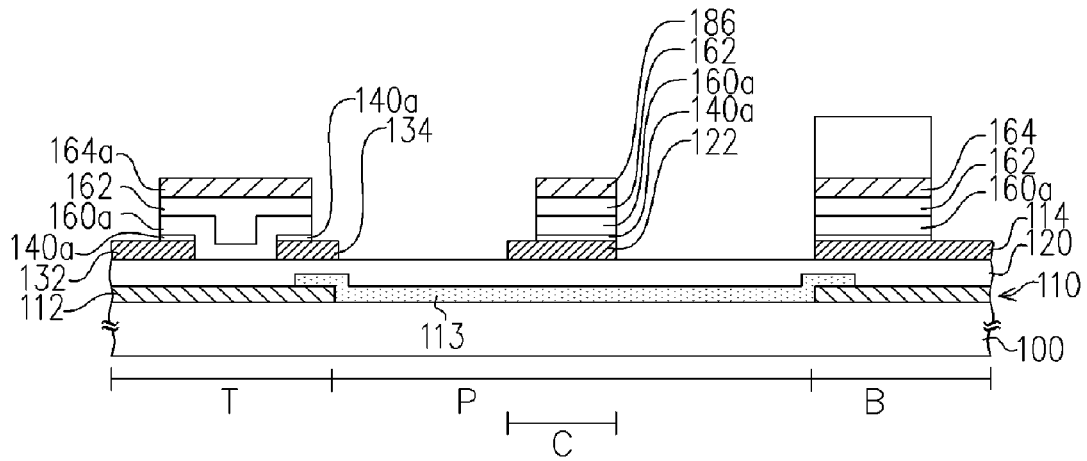
Figure 5F:
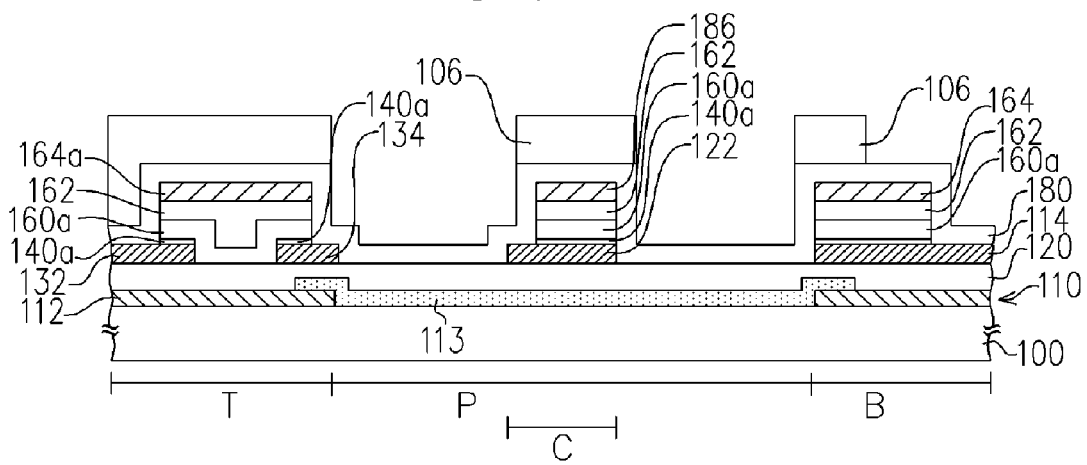
Figure 5G:
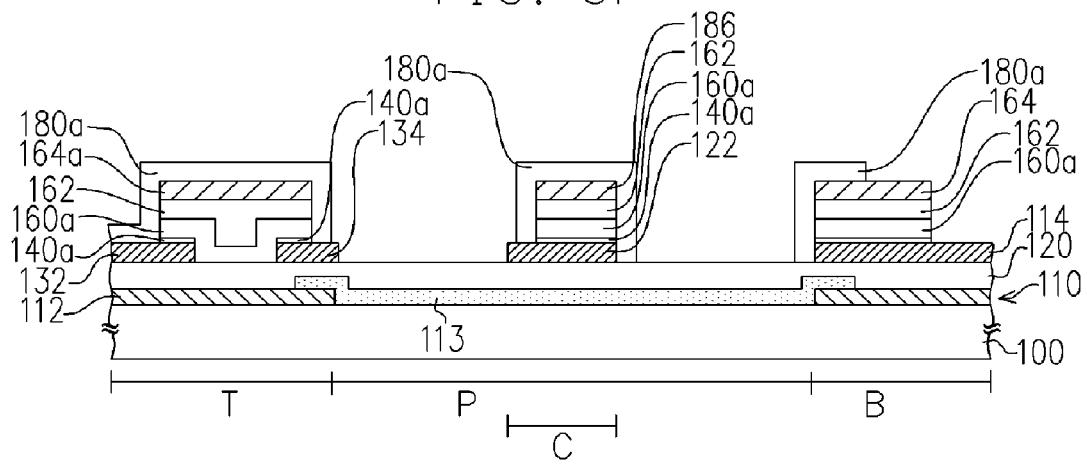
Figure 5H:
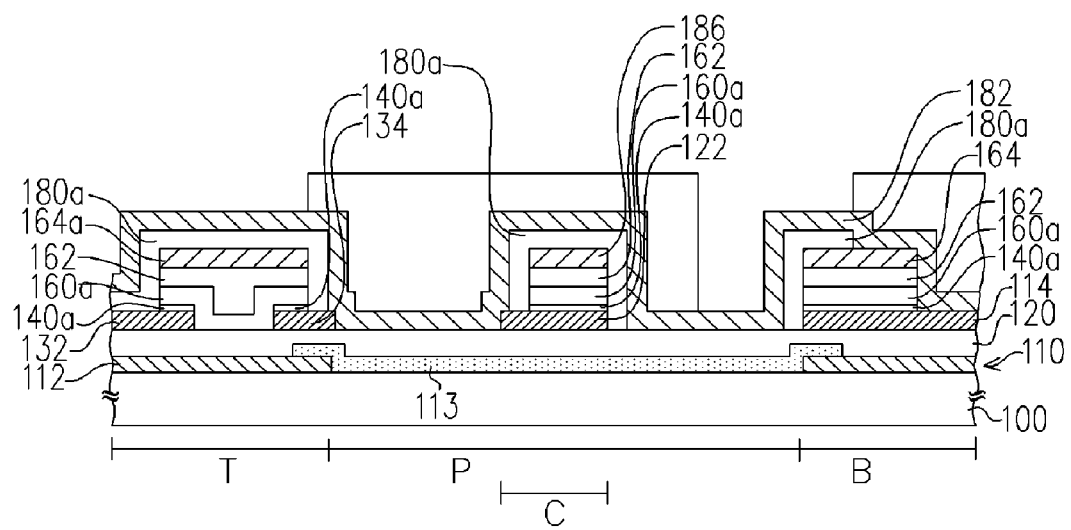

Then, steps shown in FIGS. 5D~5E are performed, which are similar to the steps in FIGS. 4D~4E. In addition to defining a gate 164a and a channel layer 162, the step further comprises reserving a gate insulating layer 162, a channel material layer 160, and a second metal layer 164a above the bottom electrode 122, wherein the reserved gate insulating layer 162 and the channel material layer 160 together form a capacitance dielectric layer, and the reserved second metal layer 164a is a common line used as a top electrode 186 on the storage capacitor C. The storage capacitor C is, for example, the Cs on common. The bottom electrode 122, the top electrode 186, and the capacitance dielectric layer together form a pixel storage capacitor. In another embodiment of the present invention, the step further comprises defining a second bonding pad 116.

Then, steps shown in FIGS. 5F~5I are performed, which are similar to the steps in FIGS. 4F~4I. These steps include depositing the passivation layer and patterning the passivation layer, depositing the transparent conductive layer and patterning the transparent conductive layer. Especially, the pixel electrode 184 defined after patterning the transparent conductive layer is electrically connected to the bottom electrode 122 exposed by the passivation layer 180a.

Pixel Structure

The pixel structure fabricated in the fabricating process described in the second embodiment is similar to the one fabricated in the first embodiment, and the difference is the storage capacitor C is Cst on common herein. The storage capacitor C comprises a bottom electrode 122, a top electrode 186 (common line), and a capacitance dielectric layer (i.e. the gate insulating layer 162 and the channel material layer 160), and the bottom electrode 122 is electrically connected to the pixel electrode P.

It is known from the description of two embodiments mentioned above, that the COA technique of the present invention where the TFT is fabricated on the color filter layer, is different from the conventional technique. In addition, the fabrication of the pixel structure only takes a four-photomask process in the present invention, thus there is one photomask fewer compared to the conventional five-sphotomask process. Accordingly, the present invention has the advantage of increasing production capacity and reducing manufacturing cost. Moreover, the four-photomask process in the present invention does not apply the halftone pattern design, thus the issue of photomask layout design and photoresist selection can be avoided, and the uneven pattern after exposure is no longer a problem.

Thin Film Transistor (TFT)

Figure 5I:
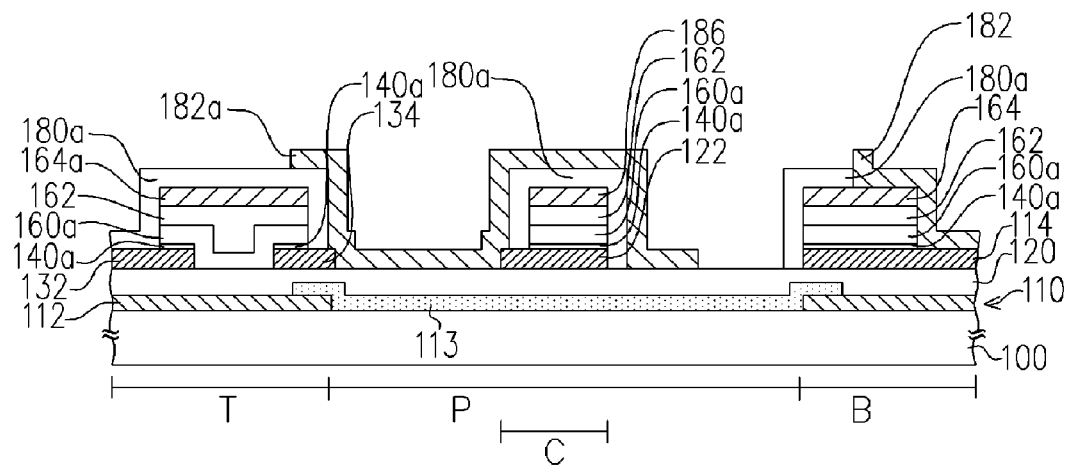

Note that in the pixel structure of both first and second embodiments, the fabricating process and structure of the TFT T are the same. For a simple description of the fabricating process and structure of TFT T, the diagram of the second embodiment is shown as an example. Referring to FIG. 5I, in the fabricating process of TFT T, a source 132 and a drain 134 are first defined. Then, when the source 132 and the drain 134 are formed, a channel layer 160a, a gate insulating layer 162, and a gate 164a are defined above the source 132 and the drain 134 in the same photomask process to form a TFT. Therefore, the source 132 and the drain 134 of the TFT formed in such a method are disposed on the bottom of the whole structure, and the source 132 and the drain 134 are covered by the channel layer 160a. In addition, the gate insulating layer 162 is disposed above the channel layer 160a. Moreover, the gate 164a is disposed above the gate insulating layer 162. In an embodiment of the present invention, the TFT T further comprises an ohmic contact material layer 140a, which is disposed between the source 132/drain 134 and the channel layer 160a. Especially, the channel layer 160a is made of amorphoussilicon, for example.

The structure and the fabricating method of the TFT provided by the present invention are different from the ones in the prior art. In terms of the sequence for forming gate on TFT and its disposed location, the gate of TFT in the prior art is formed on the substrate during the first photomask process, whereas the gate of TFT of the present invention is formed on the gate insulating layer during the second photomask process.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method of fabricating a pixel structure, comprising:
providing a substrate where a color filter layer is already formed thereon, and the color filter layer is covered by a leveling layer;
forming a first metal layer on the leveling layer;
performing a first photomask process for patterning the first metal layer, so as to define a source and a drain;
sequentially forming a channel material layer, a gate insulating layer, and a second metal layer above the substrate for covering the source and the drain;
performing a second photomask process for patterning the second metal layer, the gate insulating layer, and the channel material layer, so as to define a gate and a channel layer;
forming a passivation layer above the substrate for covering the gate;
performing a third photomask process for patterning the passivation layer, so as to expose a portion of the drain;
forming a transparent conductive layer above the substrate, wherein the transparent conductive layer is electrically connected to the exposed drain; and
performing a fourth photomask process to define a pixel electrode.

2. The method of fabricating the pixel structure of claim 1, wherein:
the second photomask process further comprises defining a bottom electrode;
the third photomask process further comprises reserving the passivation layer above the bottom electrode; and
the fourth photomask process further comprises reserving the transparent conductive layer above the passivation layer as a top electrode.

3. The method of fabricating the pixel structure of claim 1, wherein:
the first photomask process further comprises defining a bottom electrode;
the second photomask process further comprises reserving the gate insulating layer and the second metal layer above the bottom electrode for serving as a capacitance dielectric layer and a top electrode;

the third photomask process further comprises exposing a portion of the bottom electrode; and the pixel electrode defined in the fourth photomask process is electrically connected to the exposed bottom electrode.

4. The method of fabricating the pixel structure of claim 1, wherein:

the first photomask process further comprises defining a first bonding pad;

the second photomask process further comprises defining a second bonding pad;

the third photomask process further comprises exposing a portion of the first bonding pad and a portion of the second bonding pad; and the fourth photomask process further comprises reserving the transparent conductive layer above the first bonding pad and the second bonding pad.

5. The method of fabricating the pixel structure of claim 1, wherein after the first metal layer is formed above the substrate, the method further comprises forming an ohmic contact material layer above the first metal layer, and the first photomask process further comprises patterning the ohmic contact material layer.

6. The method of fabricating the pixel structure of claim 1, wherein the method of forming the color filter layer on the substrate comprises:

forming a black matrix on the substrate; and forming a plurality of Red filter patterns, a plurality of Green filter patterns, and a plurality of Blue filter patterns in the regions defined by the black matrix.

* * * * *